(12) United States Patent
Haight et al.

(10) Patent No.: US 10,008,618 B2
(45) Date of Patent: *Jun. 26, 2018

(54) LIFTOFF PROCESS FOR EXFOLIATION OF THIN FILM PHOTOVOLTAIC DEVICES AND BACK CONTACT FORMATION

(71) Applicant: INTERNATIONAL BUSINESS MACHINES CORPORATION, Armonk, NY (US)

(72) Inventors: Richard A. Haight, Mahopac, NY (US); James B. Hannon, Lake Lincolndale, NY (US); Satoshi Oida, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/658,790

(22) Filed: Jul. 25, 2017

(65) Prior Publication Data
US 2017/0323985 A1 Nov. 9, 2017

Related U.S. Application Data

(63) Continuation of application No. 14/880,808, filed on Oct. 12, 2015.

(51) Int. Cl.
*H01L 31/18* (2006.01)
*H01L 31/0224* (2006.01)
(Continued)

(52) U.S. Cl.
CPC .. *H01L 31/022441* (2013.01); *H01L 31/0324* (2013.01); *H01L 31/0326* (2013.01);
(Continued)

(58) Field of Classification Search
CPC ....... H01L 31/022441; H01L 31/03926; H01L 31/1892; H01L 31/0324; H01L 31/0326;
(Continued)

(56) References Cited

U.S. PATENT DOCUMENTS

| | | | |
|---|---|---|---|
| 6,818,530 B2 | 11/2004 | Shimoda et al. |
| 8,236,118 B2 | 8/2012 | Veerasamy |

(Continued)

FOREIGN PATENT DOCUMENTS

| | | | |
|---|---|---|---|
| CN | 1547262 A | | 11/2004 |
| CN | 103390674 B | * | 9/2015 |
| EP | 1744365 A2 | | 5/2007 |

OTHER PUBLICATIONS

Office Action for U.S. Appl. No. 15/401,381 dated Sep. 29, 2017.
(Continued)

*Primary Examiner* — Joseph C Nicely
*Assistant Examiner* — Pavel Ivanov
(74) *Attorney, Agent, or Firm* — Tutunjian & Bitetto, P.C.; Vazken Alexanian

(57) ABSTRACT

A method for forming a back contact on an absorber layer in a photovoltaic device includes forming a two dimensional material on a first substrate. An absorber layer including Cu—Zn—Sn—S(Se) (CZTSSe) is grown over the first substrate on the two dimensional material. A buffer layer is grown on the absorber layer on a side opposite the two dimensional material. The absorber layer is exfoliated from the two dimensional material to remove the first substrate from a backside of the absorber layer opposite the buffer layer. A back contact is deposited on the absorber layer.

17 Claims, 5 Drawing Sheets

(51) Int. Cl.
  *H01L 31/032* (2006.01)
  *H01L 31/0392* (2006.01)
(52) U.S. Cl.
  CPC .... *H01L 31/03926* (2013.01); *H01L 31/1892* (2013.01); *H01L 31/03923* (2013.01); *H01L 31/03925* (2013.01)
(58) Field of Classification Search
  CPC ........... H01L 31/0392; H01L 31/03925; H01L 31/03928
  See application file for complete search history.

(56) References Cited

U.S. PATENT DOCUMENTS

| | | |
|---|---|---|
| 8,481,845 B2 | 7/2013 | Sivaram et al. |
| 9,705,013 B2 | 7/2017 | Hekmatshoartabari et al. |
| 2007/0277874 A1 | 12/2007 | Dawson-Elli et al. |
| 2007/0277875 A1 | 12/2007 | Gadkaree et al. |
| 2009/0235987 A1 | 9/2009 | Akhtar |
| 2012/0141799 A1 | 6/2012 | Kub et al. |
| 2012/0295396 A1 | 11/2012 | Teeter |
| 2013/0056059 A1 | 3/2013 | Freitag |
| 2013/0074911 A1 | 3/2013 | Liao |
| 2013/0164882 A1 | 6/2013 | Afzali-Ardakani et al. |
| 2013/0269764 A1 | 10/2013 | Barkhouse et al. |
| 2013/0276888 A1 | 10/2013 | Munteanu et al. |
| 2013/0344646 A1 | 12/2013 | Liang |
| 2014/0166107 A1* | 6/2014 | Lee ..................... H01L 31/0322 136/260 |
| 2015/0027537 A1 | 1/2015 | Teraji |
| 2015/0083206 A1 | 3/2015 | Novoselov et al. |
| 2015/0160140 A1 | 6/2015 | Kang et al. |
| 2016/0204304 A1 | 7/2016 | Gunawan et al. |

OTHER PUBLICATIONS

U.S. Office Action dated Jun. 1, 2017 issued in related U.S. Appl. No. 15/401,381, pp. 1-33.

Fleutot, B. et al., "GaSe Formation at the Cu(In,Ga)Se 2 /Mo Interface—A Novel Approach for Flexible Solar Cells by Easy Mechanical Lift-Off," Advanced Materials Interfaces, vol. 1, Issue 4, Jul. 2014. (pp. 1-12).

Kim, J., et al., "Layer-Resolved Graphene Transfer via Engineered Strain Layers," Science, vol. 342, Nov. 2013. (pp. 833-836).

Liu, Z. et al., "Package-Free Flexible Organic Solar Cells with Graphene top Electrodes," Advanced Materials, vol. 25, Issue 31, Aug. 2013. (pp. 1-6).

List of IBM Patents or Patent Applications Treated as Related dated Jul. 25, 2017, 2 pages.

Office Action Issued in U.S. Appl. No. 15/401,381 dated Dec. 29, 2017, 25 pages.

U.S. Office Action Issued in U.S. Appl. No. 15/845,455 dated Apr. 5, 2018, 20 pages.

* cited by examiner

LIFTOFF PROCESS FOR EXFOLIATION OF THIN FILM PHOTOVOLTAIC DEVICES AND BACK CONTACT FORMATION

STATEMENT REGARDING FEDERALLY SPONSORED RESEARCH OR DEVELOPMENT

This invention was made with Government support under CONTRACT NUMBER: DE-EE0006334 awarded by the Department of Energy. The Government has certain rights in this invention.

BACKGROUND

Technical Field

The present invention relates to photovoltaic devices, and more particularly to exfoliation methods and devices for exfoliating absorber layers comprised of a chalcogenide compound, such as, Cu—Zn—Sn—S/Se (CZTSSe).

Description of the Related Art

Photovoltaic (PV) devices are typically fabricated from polycrystalline Si. Since Si is not a particularly good light absorber in the wavelength range emitted by the sun, it must necessarily be made thick, typically 300 micrometers or more. This leads to relatively heavy solar panels fabricated with polycrystalline Si and added expense. The expense and weight has driven the search for efficient thin film PV materials. Thin film PV absorber materials (e.g., CuInGaSe,S or CIGS, CdTe) may be about 150-300 times thinner, with thicknesses ranging from 0.5-3 microns. Such a thin absorber is made possible by the appropriate choice of materials that are extremely absorptive in the wavelength regime of peak solar irradiance.

Optimizing the performance of thin film absorbers while reducing their toxicity and dependence on rare and expensive elements suggests the use of earth abundant materials such as CuZnSnSe,S (CZTS) for example. In all cases, there is a need to both increase power conversion efficiency and reduce costs associated with manufacturing. A thin film PV device based on absorbers such as CIGS or CZTS involves the deposition of precursor elements or compounds typically onto Mo/soda lime glass. Precursors can be deposited by vacuum vapor deposition of elements onto this substrate or by solution deposition of precursor inks in a nitrogen glove box.

Upon deposition of the absorber precursors, a high temperature anneal step needs to be carried out to coarsen the grain size of a resultant polycrystalline material. The absorber material is a p-type semiconductor and to form a p-n junction, an n-type "buffer" material needs to be deposited, followed by additional n-type layers such as ZnO and indium tin oxide or Al doped ZnO and finally metal lines for current collection. The n-type buffer and subsequent layers are deposited at low or room temperature as their electrical properties are compromised by heating to temperatures above 200 C. Devices fabricated in this manner are called "substrate" grown devices. A second type of device in which the n-type materials including the buffer are deposited first followed by the absorber material and back contact are called "superstrate" grown devices. An example of this device fabrication is a CdTe based PV device. Typically, though, most thin film PV devices are grown in the substrate mode because the high temperature anneal needed to fully form the large grain polycrystalline absorber would otherwise destroy the buffer if grown in the superstrate mode. More specifically, if CIGS or CZTS is deposited on CdS or similar buffer materials, then annealed at temperatures above 300 C, interdiffusion of the buffer and absorber materials renders the device inoperable.

One of the approaches to increasing power conversion efficiency is to modify the back contact of a photovoltaic device. Access to the back contact of a typical PV device is limited because either the device is grown in a "substrate" mode, or the fully formed device needs to be separated from the Mo/glass substrate to provide access to the back contact region of the PV absorber. Separating the device from the Mo/glass substrate often results in damage to the device.

Typical separation processes involve introducing substantial thermal or mechanical stress to release the absorber from the Mo back contact. Both thermal and mechanical stressing and separation only marginally work due to cracking and pinhole formation as a result of the trauma of the separation process. In addition, these processes can only be carried out on small devices.

SUMMARY

A method for forming a back contact on an absorber layer in a photovoltaic device includes forming a two dimensional material on a first substrate. An absorber layer including Cu—Zn—Sn—S(Se) (CZTSSe) is grown over the first substrate on the two dimensional material. A buffer layer is grown on the absorber layer on a side opposite the two dimensional material. The absorber layer is exfoliated from the two dimensional material to remove the first substrate from a backside of the absorber layer opposite the buffer layer. A back contact is deposited on the absorber layer.

Another method for forming a flexible photovoltaic device includes forming graphene on a metal coated glass substrate; growing an absorber layer including Cu—Zn—Sn—S(Se) (CZTSSe) over the first substrate on the graphene; growing a buffer layer on the absorber layer on a side opposite the graphene; forming a transparent conductor over the buffer layer; exfoliating the absorber layer from the graphene to remove the metal coated glass substrate from a backside of the absorber layer opposite the buffer layer; cleaning the backside of the absorber layer; depositing a back contact on the absorber layer; and adhering the back contact to a flexible substrate to form a flexible photovoltaic device.

A photovoltaic device includes an absorber layer including Cu—Zn—Sn—S(Se) (CZTSSe) and a buffer layer grown on first side of the absorber layer. A back contact is deposited directly on a second side of absorber layer. A flexible substrate is adhered to the back contact to form a flexible photovoltaic device.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
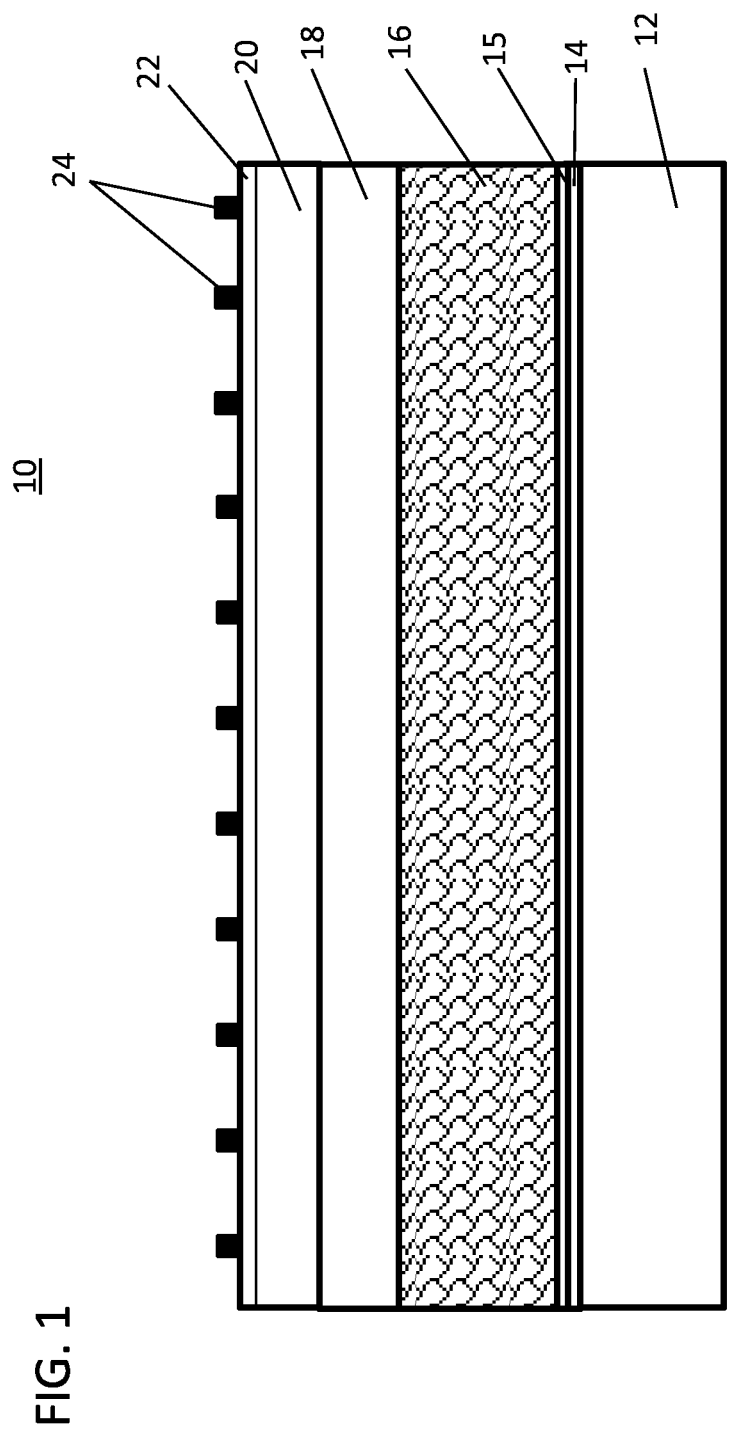
FIG. 1 is a cross-sectional view of a photovoltaic device having a CZTSSe absorber layer with a two dimensional material between a substrate and the absorber layer for gentle exfoliation in accordance with the present principles.

In accordance with the present principles, devices and methods are provided that address breaking adhesion of a back contact of an active device to a substrate by gentle exfoliation. Adhesion is needed for the device to be successfully grown atop a substrate so that the device does not peel off during high temperature processing or deposition of additional active layers (e.g., chemical bath deposition of n-type buffer for p-n junction formation, deposition of transparent conducting oxides etc.). If the adhesion is too high, however, then the exfoliation process will introduce defects into the active photovoltaic device. The present principles provide methods to gently exfoliate without creating damage to the active photovoltaic (PV) device.

In one embodiment, methods to control the adhesive properties of a full Cu—Zn—Sn—S(Se) (CZTSSe) based photovoltaic device to a molybdenum/soda lime glass substrate (or any substrate useful for forming a full photovoltaic device) are provided by inserting a single or double layer (or more) of graphene or other two-dimensional material that works as an interlayer with controllable adhesion. The methods may be employed for back contact engineering of thin film photovoltaic devices (in general) and CZTS,Se devices, in one particular case. This permits the thin film device to be controllably removed from the substrate upon which the device was grown without introducing defects into a thin absorber film. The photovoltaic device back contact can then be modified to substantially increase its efficiency through deposition of specific high work function materials. The thin film device can be processed at temperatures above 500 degrees C. to achieve maximum efficiency. The device can be grown on a robust substrate, removed without defects and then transferred onto plastic or other flexible substrates at low temperature.

Exfoliation in accordance with the present principles permits thin devices to be formed to an optimal thickness for peak device performance. Scaling exfoliation to much larger devices is desirable because manufacturing of modules based on an exfoliation process with subsequent back contact optimization and attachment to a final device with ultralow cost module substrates is economically desirable. Thin film PV devices in accordance with the present principles are gently exfoliated to remove a sizeable PV device.

It is to be understood that the present invention will be described in terms of a given illustrative architecture or photovoltaic stack; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe). The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

The present embodiments may include tandem (multi-junction) structures. The tandem structure may include two or more stacked PV devices. The present embodiments may be part of a photovoltaic device or circuit, and the circuits as described herein may be part of a design for an integrated circuit chip, a solar cell, a light sensitive device, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic structure 10 is illustratively depicted in accordance with one embodiment. The photovoltaic structure 10 may be employed in solar cells, light sensors, photosensitive devices or other photovoltaic applications. The structure 10 includes a substrate 12. The photovoltaic structure 10 is a "substrate" fabricated device, which is built up from the substrate 12. The substrate 12 may include glass, such as soda lime glass or other inexpensive substrates, such as metal, plastic or other material suitable for photovoltaic devices (e.g., quartz, silicon, etc.). A conductive layer 14 is formed on the substrate 12. The conductive layer 14 may include molybdenum although other high work-function materials may be employed (e.g., Pt, Au, etc.). The layer 14 provides a metal contact.

A two-dimensional material 15 is formed on the substrate 12, which is coated with the conductive material 14 (e.g., Mo). The two-dimensional (2D) material of layer 15 includes strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials can be employed as interlayers to facilitate layer transfer of subsequently grown films.

In one particularly useful embodiment, the layer 15 includes graphene. Graphene is atomically smooth and when applied to the layer 14, a small thickness is desired. In one embodiment, the thickness of the graphene layer 15 is preferably one or more monolayers formed as a single crystal or single sheet. In useful embodiments, the number of monolayers of graphene may be determined depending on what is needed to cleanly separate the graphene to produce a split as will be described. Graphene may be deposited using a chemical vapor deposition (CVD) process.

In another embodiment, graphene is employed as an adhesion layer to weaken the adhesion between layers adjacent to the graphene. A single (or double) atomic layer of graphene is grown in a tube furnace. In one embodiment, a 0.25 inch×1.0 inch Cu foil (99.8%) placed on a quartz holder is introduced into a 1 inch quartz tube. The tube is evacuated using a turbo pump to a base pressure of about $1 \times 10^{-8}$ Torr. After the tube temperature reached 1050 degrees C., 5 sccm of $CH_4$ was introduced into the tube for 3 minutes to form small graphene seed islands on the Cu foil at the same temperature. A 10 sccm flow of $CH_4$ was introduced for about 10 minutes resulting in the growth of monolayer graphene on the Cu foil. Once a layer of graphene is grown on the Cu foil, the graphene is separated from the Cu by etching the Cu away in a liquid solution of, e.g., 1 mol/l $FeCl_3$. A single layer of graphene is then floated from the etchant to an adjacent vessel of water. The graphene can be coated onto the layer 14 by bringing the substrate 12/layer 14 underneath the film 15 and out of the water bath. The graphene of layer 15 fully coats the substrate 12/layer 14. Additional monolayers may be added in a similar fashion.

After drying, the graphene of layer 15 is ready for deposition of an absorber layer 16. While the present embodiments will be described in terms of a graphene structure, other 2D materials may be employed for the layer 15, e.g., $MoS_2$ or other materials.

The absorber layer may include a polycrystalline CZTSSe layer 16. Layer 16 includes a Cu—Zn—Sn containing chalcogenide compound with a kesterite structure of the formula: $Cu_{2-x}Zn_{1+y}Sn(S_{1-z}Se_z)_{4+q}$ wherein $0 \le x \le 1$; $0 \le y \le 1$; $0 \le z \le 1$; $-1 \le q \le 1$ (hereinafter CZTSSe). In a particularly useful embodiment, the Cu—Zn—Sn-containing chalcogenide includes $Cu_2ZnSn(S,Se)_4$. In one embodiment, the CZTSSe film or layer 16 has a thickness of between about 0.2 to 4.0 microns and more preferably about 2 microns. Layer 16 may be spun on or vapor deposited on the two-dimensional material 15. Deposition is carried out either by vacuum deposition of the individual elements or via solution phase deposition. In one embodiment, following deposition, the absorber layer 16 may be annealed at about 600 C for 2 minutes, cooled, then annealed in air at 375 C for 10 minutes.

In one illustrative embodiment, layer 16 provides a band gap ($E_g$) from about 1 to 1.5 eV. Although the major elements in CZTSSe are Cu, Zn, Sn, S, Se, reference to CZTSSe or Cu—Zn—Sn containing chalcogenide material also includes compositions that optionally contain Ge replacing some or all of the Sn and contain Fe replacing some or all of the Zn and that may also contain other dopants, including Sb, Bi, Na, K, Li, Ca, etc.

CZTSSe has many benefits. It is low cost and environmentally harmless, being fabricated using naturally abundant materials. CZTSSe provides good optical properties and has a band-gap energy from approximately 1 to 1.5 eV, depending on the degree of substitution of S with Se, and a large absorption coefficient in the order of $10^4$ $cm^{-1}$. Reducing the reliance on rare indium metal (also heavily consumed by one of the fastest growing industries—thin film displays) opens the possibility of almost limitless material supply.

A buffer layer 18 is formed or grown on layer 16. The buffer layer 18 may include multiple layers. In one embodiment, the buffer layer 18 includes a semiconductor material, e.g., from groups IV, III-V, II-VI or I-III-VI$_2$. The semiconductor material of buffer layer 18 may include, e.g., GaAs, Cu—In—Ga—S,Se (CIGSSe), CdTe, CdS, Ge, etc. The buffer layer 18 may include polycrystalline and even amorphous material.

In one embodiment, CIGSSe may be employed for layer 18 and has a chemical formula of CuIn$_x$Ga$_{(1-x)}$Se$_2$ where the value of x can vary from 1 (pure copper indium selenide) to 0 (pure copper gallium selenide). CIGSSe is a tetrahedrally bonded semiconductor, with the chalcopyrite crystal structure, and a bandgap varying continuously with x from about 1.0 eV (for copper indium selenide) to about 1.7 eV (for copper gallium selenide). CIGSSe layer 18 provides high performance as open circuit voltage (Voc) provided using this material is very high relative to bandgap (Eg) (e.g., Eg/q–Voc~0.5 V) and no known issues of interface recombination. In a particularly useful embodiment, layer 18 may include CdS. The CdS buffer layer 18 may be formed in a chemical bath.

The buffer layer 18 may include a second semiconductor material such as, e.g., CdTe, ZnS, Zn(O,S), In$_2$S$_3$, ZnO, etc. In some embodiments, the layer 18 may include a thickness of between about 0.05 to about 2.0 microns. Although other thicknesses and material combinations are contemplated.

A transparent conductive layer 20 is formed over the buffer layer 18. The transparent conductive layer 20 may include a transparent conductive oxide (TCO), such as, e.g., indium tin oxide (no), fluorine doped tin oxide (FTO), aluminum doped zinc oxide (AZO), boron doped zinc oxide (BZO) or other TCO materials or combinations of these or other materials. The transparent conductive layer 20 may include one or more layers. The one or more layers may include an antireflection coating (ARC) 22 or other different transparent conductive materials, e.g., layer 20 may include ITO and ZnO. The transparent conductive layer 20 may include a thickness of between about 100 nm to about 5 microns. Layer 20 forms a contact for a photovoltaic device 10.

Metal contacts or wires 24 may be formed on the transparent conductive layer 20 (or ARC 22, if present) to further enhance the conductive properties of the transparent conductive layer 20. The metal contacts 24 may include Ni, Al, Mo, Ag, Au, or any other suitable metal or alloy. Since the metal contacts 24 are on the front, light receiving side of the device 10, their size should be optimized to minimize shadowing loss and resistive loss.

Figure 2:
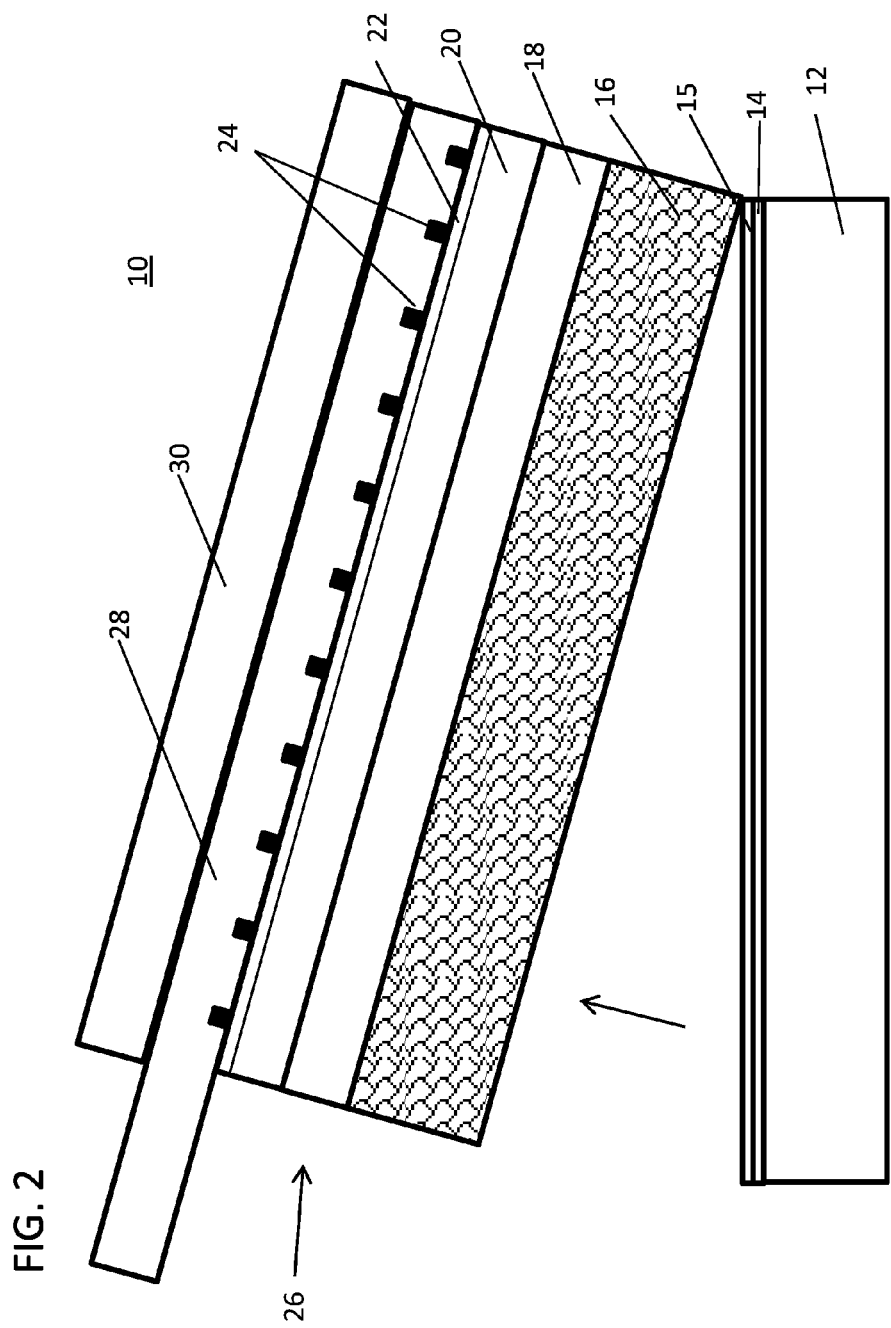
FIG. 2 is a cross-sectional view of the photovoltaic device of FIG. 1 showing exfoliation of the substrate from the absorber layer using the two dimensional material in accordance with the present principles.

Referring to FIG. 2, exfoliation is carried out to separate the absorber layer 16 from the substrate 12/layer 14. Once the device 10 is fabricated, it is measured for efficiency on a solar simulator. Then, the sample is ready for exfoliation. To exfoliate a top portion (front surface) 26, a thin acrylic sheet or tape 28 with an adhesive is taped onto the front surface 26 of the device. A thick (e.g., 1 mm) piece of glass 30 or other stiff material is epoxied onto the acrylic tape 28 for stiffness, without this the exfoliated device may curl and create cracks in the absorber layer 16. The device 10 is then attached to a coolable plate in a vacuum system with thermal paste, and the temperature is reduced (e.g., to less than about 200 degrees K). The difference in thermal expansion coefficient between the acrylic tape 28 and the device 10 is sufficient to cause delamination between the graphene layer 15 and the absorber layer 16 above the layer 15.

Alternatively, the device may be exfoliated by epoxying a glass chip to the top portion 26 of the device 10 and mechanically separating the top portion 26 from the substrate 12. Such mechanical exfoliation involves an impulsive force applied perpendicular to the device 10 normal (e.g., parallel to the device surface).

In either method, the reduced adhesion of the absorber layer 16 to the graphene layer 15 minimizes the trauma to the absorber layer 16 thereby minimizing defects such as cracking and pinhole creation. The introduction of the graphene layer 15, e.g., a single or double (or more) layer, dramatically reduces introduction of exfoliation related damage to the active device 10.

Following exfoliation, the graphene is removed from the back of the absorber layer 16. This may be done by exposure to O$_3$ (ozone) or carried out in a reactive ion etcher with oxygen plasma. The use of graphene 15 as an intermediate strength adhesion layer also enhances manufacturability. For scaling photovoltaics to large areas or for deposition onto flexible substrates, large area graphene layers with intermediate adhesion provides an effective approach for peeling large areas of photovoltaic devices from substrates, modifying the back contacts and then reattaching to an appropriate carrier substrate such as plastic, glass, ceramic or metal foils. This achieves high efficiency performance in CZTS based devices by permitting thermal processing to temperatures of ~600 C. Flexible polymer based substrates cannot withstand such temperatures without decomposing. As a result, the device 10 can be fabricated at a high temperature, and the inflexible substrate (such as Mo/soda lime glass of substrate 12/layer 14) can be gently exfoliated in a manner that does not damage the delicate and thin CZTSSe absorber layer 16. A back contact can be added and modified in any chosen manner and then the thin device can be attached to an appropriate low temperature flexible substrate.

Figure 3:
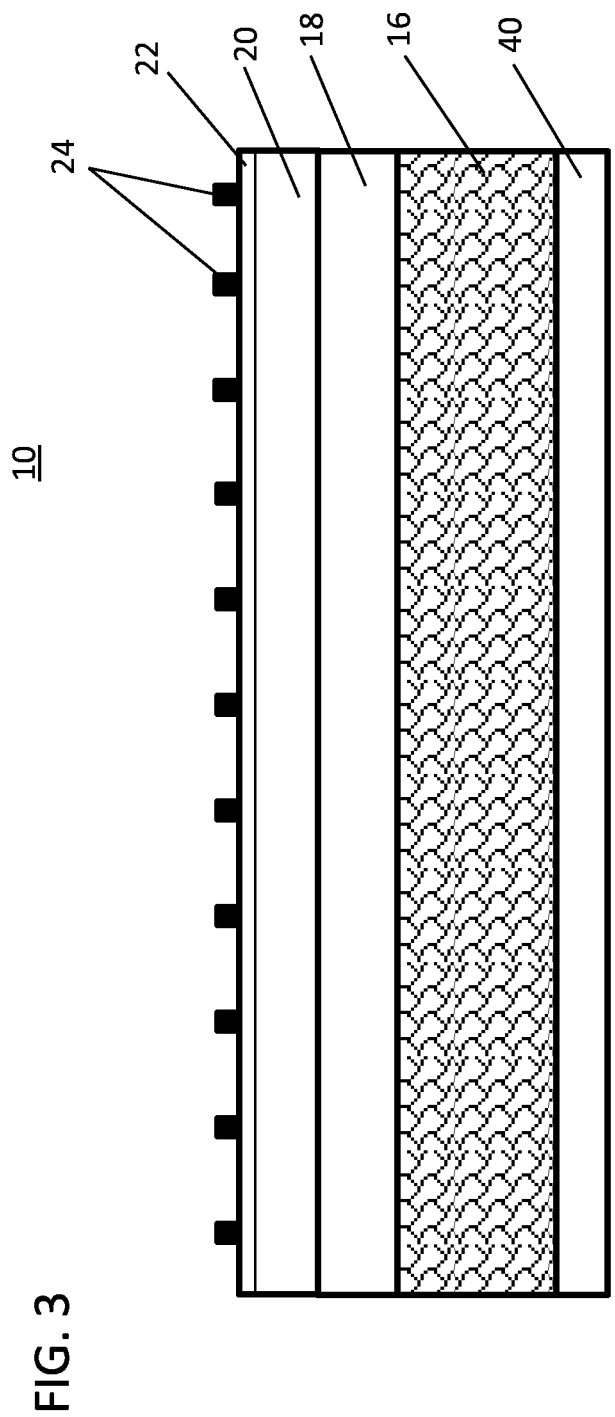
FIG. 3 is a cross-sectional view of the photovoltaic device of FIG. 2 having a back contact formed on the absorber layer in accordance with the present principles.

Referring to FIG. 3, a back contact 40 is formed on a back surface of the absorber layer 16. The absorber layer 16 is a substrate formed layer. Once exfoliated the absorber layer 16 can be cleaned by an oxygen based etch. The back contact 40 may be formed by sputtering, evaporation, CVD or any other suitable deposition process. The back contact 40 may include Mo, Al, Cu, or any other suitable conductive material.

Figure 4:
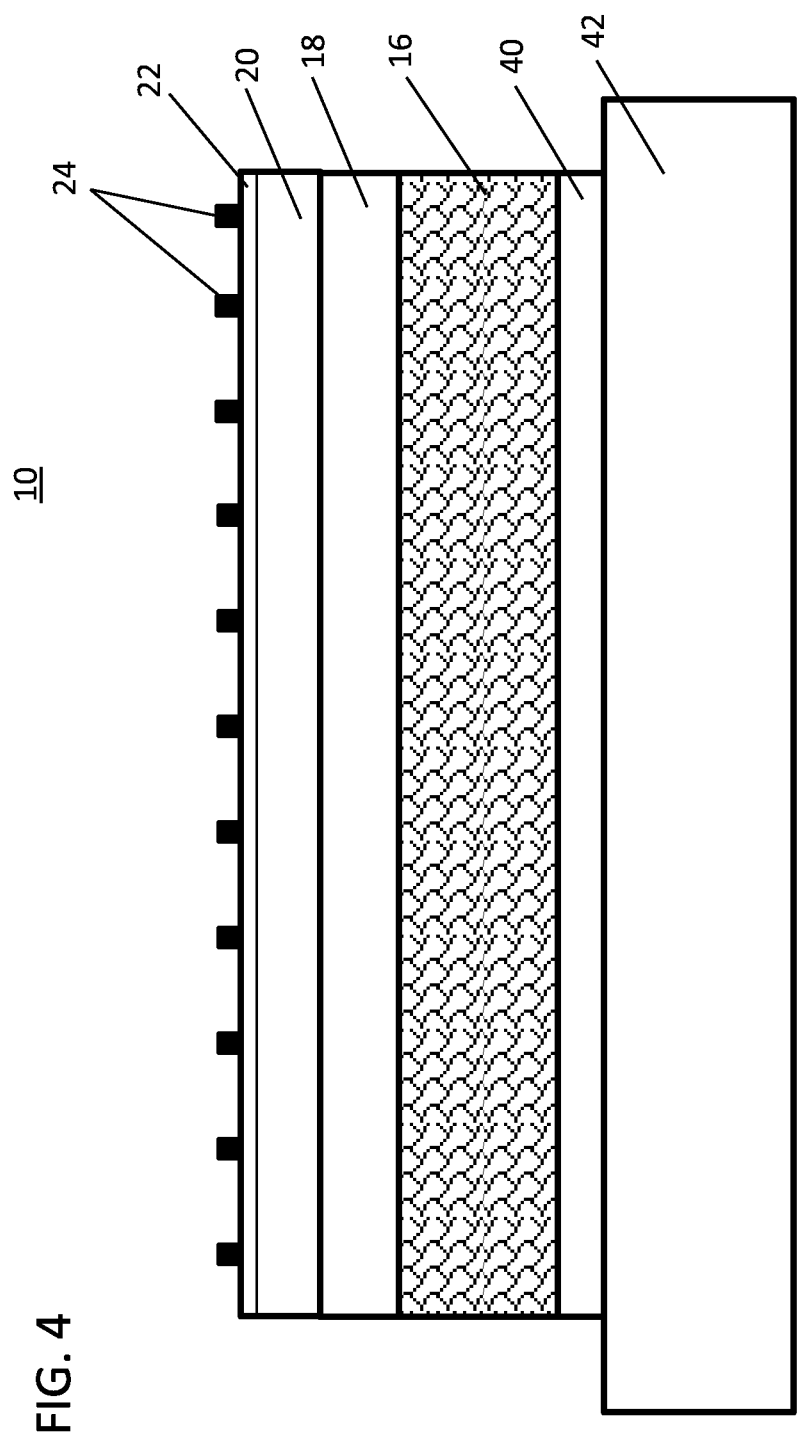
FIG. 4 is a cross-sectional view of the photovoltaic device of FIG. 3 having a substrate adhered to the back contact in accordance with the present principles.

Referring to FIG. 4, a substrate 42 is adhered to the back contact 40. In one embodiment, the substrate 42 includes a flexible substrate and may include a polymeric material or metal foil. In other embodiments, the substrate 42 may include a glass or rigid material. The back contact 42 may be adhered to the substrate 42 using glue or other adhesive material. Using a flexible substrate 42, the device 10 can be mounted on curved surfaces or rolled up or folded as needed. The device 10 may be on the order of square inches or even square feet in size.

Figure 5:
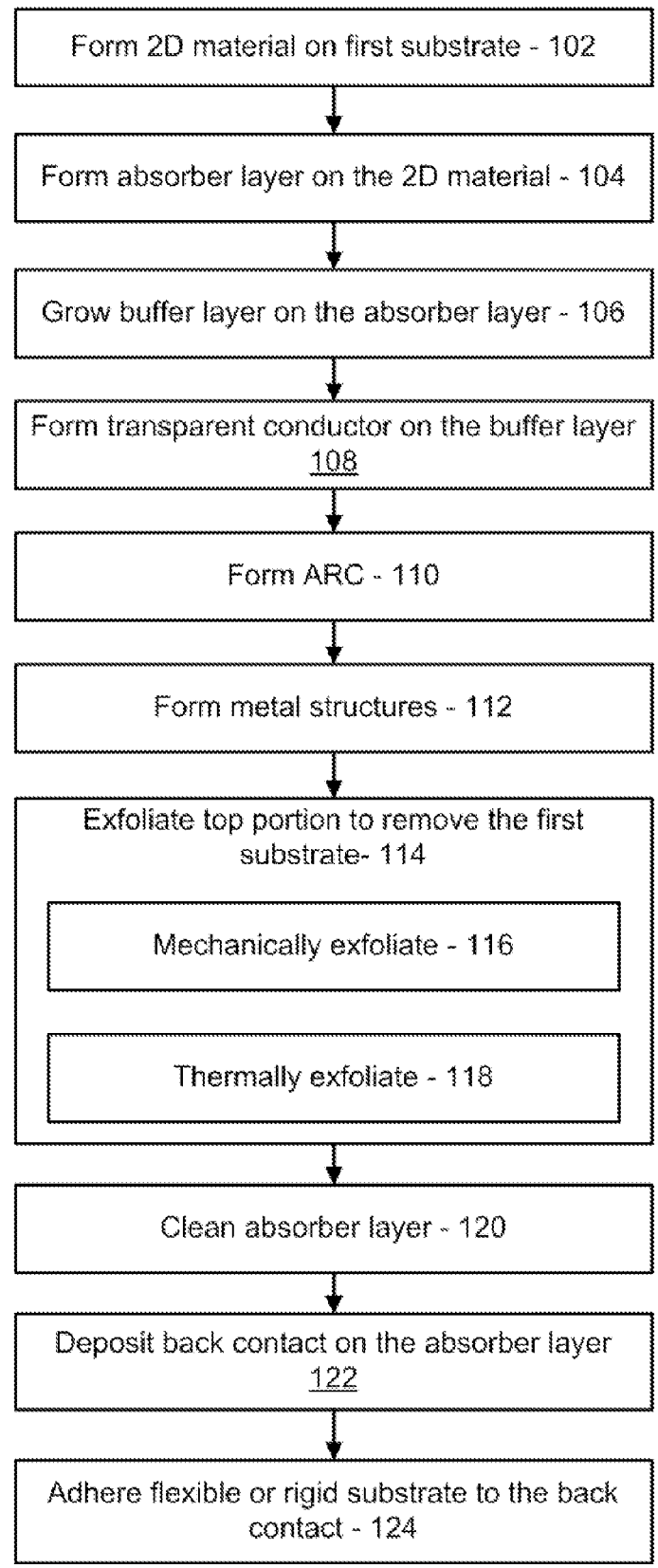
FIG. 5 is a block/flow diagram showing a method for forming a photovoltaic device with an absorber layer in accordance with illustrative embodiments.

Referring to FIG. 5, methods for fabricating a photovoltaic device are shown in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, a two-dimensional material is formed on a first substrate. The two-dimensional material preferably includes graphene. The graphene may include one or more monolayers. The first substrate may include a metal coated glass, and, in particular, Mo coated glass. In block 104, an absorber layer including Cu—Zn—Sn—S(Se) (CZTSSe) is grown over the first substrate on the two-dimensional material. The absorber layer may be spun on or vapor deposited on the two-dimensional material. In block 106, a buffer layer is grown on the absorber layer on a side opposite the two-dimensional material. In block 108, a transparent conductor is formed over the buffer layer. In block 110, an antireflection coating (ARC) may be formed on the transparent conductor. In block 112, metal structures may be formed on the transparent conductor.

In block 114, a top portion including the absorber layer is exfoliated from the two-dimensional layer to remove the metal coated glass substrate from a backside of the absorber layer, which is opposite the buffer layer. The exfoliation may include using adhesive tape and a rigid substrate. Different splitting processes may be employed. For example, in block 116, the absorber layer may be exfoliated by mechanically splitting the two-dimensional material. The tape may be pulled to cause a split in the two-dimensional layer to gently exfoliate the absorber layer with minimal damage. In another embodiment, in block 118, the absorber layer may be exfoliated by thermally splitting the two-dimensional material. The device is cooled to cause a split in the two-dimensional layer to gently exfoliate the absorber layer with minimal damage. A combination of these techniques may also be employed.

In block 120, the backside of the absorber layer is cleaned, e.g., using oxygen etching. In block 122, a back contact is deposited on the absorber layer. This may include an evaporative process, a sputtering process, CVD, etc. to deposit metal on the exposed back surface of the absorber layer. In block 124, the back contact is adhered to a another substrate. The substrate may be rigid, or may be flexible to form a flexible photovoltaic device.

Having described preferred embodiments for a liftoff process for exfoliation of thin film photovoltaic devices and back contact formation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a back contact on an absorber layer in a photovoltaic device, comprising:
   growing an absorber layer including Cu—Zn—Sn—S (Se) (CZTSSe) over a two dimensional material on a first substrate;
   exfoliating the absorber layer from the two dimensional material to remove the first substrate from a backside of the absorber layer; and
   forming a back contact on the absorber layer.

2. The method as recited in claim 1, wherein the first substrate includes a metal coated glass.

3. The method as recited in claim 1, wherein the two dimensional material includes one or more monolayers of graphene.

4. The method as recited in claim 1, further comprising adhering the back contact to a flexible substrate to form a flexible photovoltaic device.

5. The method as recited in claim 1, wherein exfoliating the absorber layer includes mechanically splitting the absorber layer from the two dimensional material.

6. The method as recited in claim 1, wherein exfoliating the absorber layer includes thermally splitting the absorber layer from the two dimensional material.

7. The method as recited in claim 1, further comprising forming a transparent conductor over a buffer layer formed on the absorber layer on a side opposite the two dimensional material.

8. The method as recited in claim 7, further comprising forming metal structures on the transparent conductor.

9. A method for forming a flexible photovoltaic device, comprising:
   forming graphene on a metal coated glass substrate;
   forming an absorber layer including Cu—Zn—Sn—S(Se) (CZTSSe) over the first substrate on the graphene;
   exfoliating the absorber layer from the graphene to remove the metal coated glass substrate from a backside of the absorber layer;
   cleaning the backside of the absorber layer; and
   depositing a back contact on the absorber layer.

10. The method as recited in claim 9, wherein the graphene includes one or more monolayers.

11. The method as recited in claim 9, wherein exfoliating the absorber layer includes mechanically splitting the absorber layer from the graphene.

12. The method as recited in claim 9, wherein exfoliating the absorber layer includes thermally splitting the absorber layer from the graphene.

13. The method as recited in claim 9, further comprising:
   growing a buffer layer on the absorber layer on a side opposite the graphene;
   forming a transparent conductor over the buffer layer; and
   forming metal structures on the transparent conductor.

14. The method as recited in claim 13, further comprising forming an antireflection coating on the transparent conductor.

15. The method as recited in claim 13, further comprising adhering the back contact to a flexible substrate to form a flexible photovoltaic device.

16. The method as recited in claim 15, wherein the flexible substrate includes a polymeric material.

17. The method as recited in claim 15, wherein the flexible substrate includes metal.

* * * * *